United States Patent
Lu

(10) Patent No.: US 9,567,460 B2
(45) Date of Patent: Feb. 14, 2017

(54) MOLDED REFLECTORS FOR LIGHT-EMITTING DIODE ASSEMBLIES

(71) Applicant: Ticona LLC, Florence, KY (US)

(72) Inventor: Bing Lu, Union, KY (US)

(73) Assignee: Ticona LLC, Florence, KY (US)

( * ) Notice: Subject to any disclaimer, the term of this patent is extended or adjusted under 35 U.S.C. 154(b) by 0 days.

(21) Appl. No.: 14/109,510

(22) Filed: Dec. 17, 2013

(65) Prior Publication Data

US 2014/0167088 A1    Jun. 19, 2014

Related U.S. Application Data

(60) Provisional application No. 61/738,765, filed on Dec. 18, 2012.

(51) Int. Cl.
| | | |
|---|---|---|
| H01L 33/56 | (2010.01) | |
| C08L 67/02 | (2006.01) | |
| F21V 7/22 | (2006.01) | |
| H01L 33/60 | (2010.01) | |

(52) U.S. Cl.
CPC ............... C08L 67/02 (2013.01); F21V 7/22 (2013.01); H01L 33/60 (2013.01); H01L 2224/48095 (2013.01); H01L 2224/48247 (2013.01); H01L 2933/0058 (2013.01)

(58) Field of Classification Search
CPC ........................................... H01L 33/60
USPC ............................................. 257/98
See application file for complete search history.

(56) References Cited

U.S. PATENT DOCUMENTS

| | | |
|---|---|---|
| 4,111,892 A | 9/1978 | Kamada et al. |
| 4,608,623 A | 8/1986 | Stephano |
| 4,753,890 A | 6/1988 | Smith-Lewis et al. |
| 4,753,980 A | 6/1988 | Deyrup |
| 4,859,732 A | 8/1989 | Minnick |
| 4,990,549 A | 2/1991 | Delvin et al. |
| 4,999,055 A | 3/1991 | Holtzen et al. |

(Continued)

FOREIGN PATENT DOCUMENTS

| | | |
|---|---|---|
| CN | 101565538 A | 10/2009 |
| EP | 0273149 | 6/1988 |

(Continued)

OTHER PUBLICATIONS

International Search Report and Written Opinion for Application PCT/US2013/075318 dated Apr. 3, 2014.

(Continued)

*Primary Examiner* — Marcos D Pizarro
*Assistant Examiner* — Tifney Skyles
(74) *Attorney, Agent, or Firm* — Dority & Manning, P.A.

(57) ABSTRACT

Polymer compositions are described that are well suited for producing reflectors for light-emitting devices, such as light-emitting diodes. In one particular embodiment, the polymer composition contains a polymer resin, a white pigment, a silicone compound, and a nucleating agent. The polymer resin may comprise, for instance, a poly(1,4-cyclohexanedimethanol terephthalate). In accordance with the present disclosure, the composition also contains at least one silicone compound and at least one nucleating agent. The silicone compound and nucleating agent have been found to improve the molding processability and reflectance stability of the polymer composition.

34 Claims, 2 Drawing Sheets

(56) References Cited

U.S. PATENT DOCUMENTS

| | | |
|---|---|---|
| 5,015,942 A | 5/1991 | Kolanko |
| 5,207,967 A | 5/1993 | Small, Jr. et al. |
| 5,256,787 A | 10/1993 | Borzatta et al. |
| 5,428,086 A | 6/1995 | Minnick et al. |
| 5,596,049 A | 1/1997 | Gallucci et al. |
| 5,707,437 A | 1/1998 | Niedenzu et al. |
| 5,965,261 A | 10/1999 | Webster |
| 6,063,874 A | 5/2000 | Jin et al. |
| 6,093,765 A | 7/2000 | Cottis |
| 6,197,873 B1 | 3/2001 | Miyata et al. |
| 6,236,061 B1 | 5/2001 | Walpita |
| 6,707,437 B1 | 3/2004 | Kuno |
| 6,878,972 B2 | 4/2005 | Waalib-Singh et al. |
| 7,381,996 B2 | 6/2008 | Hsin Chen |
| 7,667,239 B2 * | 2/2010 | Pang et al. ............... 257/98 |
| 7,709,568 B2 | 5/2010 | Bersted et al. |
| 7,999,280 B2 | 8/2011 | Kim et al. |
| 8,007,885 B2 | 8/2011 | Topoulos |
| 8,013,057 B2 | 9/2011 | Taguchi et al. |
| 8,070,316 B2 | 12/2011 | Urano et al. |
| 8,288,793 B2 | 10/2012 | Kim et al. |
| 8,480,254 B2 | 7/2013 | Lu |
| 8,545,718 B2 | 10/2013 | Nakayama et al. |
| 2003/0065106 A1 | 4/2003 | Ambrose |
| 2003/0096122 A1 | 5/2003 | Mercx et al. |
| 2003/0109629 A1 | 6/2003 | Pierre et al. |
| 2003/0178221 A1 | 9/2003 | Chiu et al. |
| 2004/0156213 A1 | 8/2004 | Lodhie |
| 2005/0007772 A1 | 1/2005 | Yen |
| 2005/0043483 A1 | 2/2005 | Kim et al. |
| 2005/0085589 A1 | 4/2005 | Kim |
| 2005/0118393 A1 | 6/2005 | Corcoran et al. |
| 2005/0176835 A1 | 8/2005 | Kobayashi et al. |
| 2006/0230553 A1 | 10/2006 | Thullen et al. |
| 2007/0093588 A1 | 4/2007 | Takahashi et al. |
| 2007/0155913 A1 | 7/2007 | Chakravarti et al. |
| 2007/0213458 A1 * | 9/2007 | Topoulos ............... 524/601 |
| 2007/0275242 A1 | 11/2007 | Gopal et al. |
| 2009/0014505 A1 | 1/2009 | Cretegny et al. |
| 2009/0130451 A1 | 5/2009 | Farrell |
| 2009/0141505 A1 | 6/2009 | Ushiki et al. |
| 2009/0239997 A1 | 9/2009 | Taguchi et al. |
| 2009/0277858 A1 | 11/2009 | Mitadera et al. |
| 2010/0032702 A1 | 2/2010 | Lahijani |
| 2010/0200882 A1 | 8/2010 | Kotani et al. |
| 2010/0309571 A1 | 12/2010 | Watari et al. |
| 2011/0189453 A1 | 8/2011 | Leemans et al. |
| 2011/0310622 A1 | 12/2011 | Topoulos |
| 2012/0097894 A1 | 4/2012 | Nakayama et al. |
| 2012/0262925 A1 | 10/2012 | Lu |
| 2012/0262927 A1 | 10/2012 | Lu |
| 2012/0264868 A1 | 10/2012 | Lu |
| 2013/0158184 A1 | 6/2013 | Topoulos |
| 2014/0167088 A1 | 6/2014 | Lu |
| 2014/0299907 A1 | 10/2014 | Lu |

FOREIGN PATENT DOCUMENTS

| | | |
|---|---|---|
| EP | 0485240 | 5/1992 |
| EP | 0684648 | 11/1995 |
| EP | 1798268 | 6/2007 |
| JP | 55027335 A | 2/1980 |
| JP | 03084060 | 9/1991 |
| JP | 04142362 | 5/1992 |
| JP | H06151977 | 5/1994 |
| JP | 11087780 A | 3/1999 |
| JP | 2002302596 A | 10/2002 |
| JP | 2003124521 | 4/2003 |
| JP | 2003262701 A | 9/2003 |
| JP | 2005038661 A | 2/2005 |
| WO | WO 02/052615 A2 | 7/2002 |
| WO | WO 03/085029 A1 | 10/2003 |
| WO | WO 2008/002362 A1 | 1/2008 |
| WO | WO 2010000838 | 1/2010 |
| WO | WO 2010/049531 A1 | 5/2010 |
| WO | WO 2011/040138 A1 | 7/2011 |
| WO | WO 2012/141967 A1 | 10/2012 |
| WO | WO 2013/101277 A1 | 4/2013 |

OTHER PUBLICATIONS

DuPont Ti-Pure®; "Titanium Dioxide for Coatings", Jun. 2007; pp. 1-28.

IARC Working Group on the Evaluation of Carcinogenic Risks to Humans: "Titanium Dioxide", in IARC Monographs on the Evaluation of Carcinogenic Risks to Humans, Carbon Black, Titanium Dioxide and Talc, IARC MONOGRAPHS, vol. 93, 2010; pp. 193-214.

Temple C. Patton, "Pigment Handbook, vol. II, Applications and markets"; John Wiley & Sons; dated 1973.

Bing Lu, U.S. Appl. No. 14/360,016, filed May 22, 2014, Reflector for Light-Emitting Devices.

International Search Report for PCT/US2012/032041, dated Oct. 8, 2012.

International Search Report for PCT/US2012/032262, dated Jun. 26, 2012.

International Search Report for PCT/US2012/032267, dated Jun. 26, 2012.

* cited by examiner

MOLDED REFLECTORS FOR LIGHT-EMITTING DIODE ASSEMBLIES

RELATED APPLICATIONS

The present application claims priority to U.S. Provisional Patent Application Ser. No. 61/738,765, filed on Dec. 18, 2012, which is incorporated herein in its entirety by reference thereto.

BACKGROUND

Light-emitting diodes, commonly called LEDs, continue to increase in popularity as a light source for use in many and diverse applications. The demand for LEDs has grown rapidly, especially in the last five years. LEDs are being used as light sources in numerous applications due to their many advantages over conventional light sources. LEDs generally consume significantly less power than incandescent and other light sources, require a low voltage to operate, are resistant to mechanical shock, require low maintenance, and generate minimal heat when operating. As a result, LEDs are displacing incandescent and other light sources in many uses and have found applications, for instance, as traffic signals, large area displays, interior and exterior lighting, cellular telephone displays, digital clock displays, displays for consumer appliances, flashlights, and the like.

LEDs generally include a light-emitting diode mounted on a substrate that is electrically connected to a lead frame. The lead frame typically includes two terminals for connecting the LED to a power source. The light-emitting diode is a semiconductor device fabricated similar to the manner in which integrated circuits are produced. For instance, the light-emitting diode can be made from several layers of material that are sequentially deposited on a semiconductor substrate. The light-emitting diode within the semiconductor material includes an n-type material separated from a p-type material by an active layer. When a voltage is applied to the diode, positive charges or "holes" from the p-type material move towards the active layer while the negative charges or electrons from the n-type material also move towards the active layer in an opposite direction which produces light. In particular, the moving electrons release energy in the form of photons. Thus, one significant advantage of LEDs is that the devices produce light without a filament that will burn out over time. Thus, LEDs last a relatively long time, can be made to be very compact, and are very durable. Further, since a filament is not heated in order to produce light, LEDs are also very energy efficient.

After a light-emitting diode is fabricated, the semiconductor chip can be mounted adjacent to a reflector and connected to a lead frame. The lead frame can include an anode terminal and a cathode terminal for applying power to the assembly. In certain embodiments, the LED element located within the reflector can be sealed by a translucent or transparent resin. The transparent or translucent resin may serve as a lens for further enhancing the light that is emitted.

The reflector for the LED can also serve as the housing for the LED and is typically made from a molded polymeric resin. For example, the polymeric resin can be injection molded to form the housing and reflector. In one embodiment, the polymeric resin is injection molded over a lead frame for integrating the lead frame into the LED assembly.

The molded polymer resin used to form the reflector preferably possesses a particular combination of characteristics and properties. For instance, the polymer resin should be well suited to reflecting light at the wavelength at which the LED operates. Many LEDs, for instance, are designed to emit a white light. Thus, the polymer resin used to form the reflector should reflect a significant amount of light in the visible light region and particularly should reflect a significant percentage of light in the blue light wavelength range. Reflecting light in the blue wavelength range, for instance, has been found to significantly enhance the brightness of the LED, since white light emitted by an LED contains a significant amount of light in the blue wavelength range. Increasing the reflectance of the reflector as high as possible minimizes loss of light when the LED is being operated.

The polymer resin used to form the reflector should also possess a high whiteness index. The whiteness index of the reflector indicates how well the reflector can reflect light over the entire visible light wavelength range (from about 400 nm to about 700 nm). In general, the higher the whiteness index of the material, the higher the reflectance of the material. A material possessing a white index value of 100, for instance, is considered a substantially perfect reflecting diffuser.

In addition to having excellent reflectance properties, the polymer resin used to form the reflector should also have good melt flow properties during injection molding of the parts. For instance, many LED structures are relatively small having dimensions that at times can be less than 1 millimeter. Reflectors can also have relatively complex shapes depending upon the particular application and the geometries of the lead plate in the LED. Thus, when the polymer resin is heated, the polymer should have sufficient flow properties in order to uniformly and repeatedly fill the interstices of the mold. The polymer resin should also have a stable viscosity that does not fluctuate during processing.

In addition to the above, the polymer resin used to form the reflector should have sufficient heat resistance including long term aging stability when either being soldered onto an adjacent part or when exposed to the operating temperatures of the LED. Many LED assemblies, for instance, are attached to circuit boards and other substrates using reflow oven welding processes that operate at temperatures up to about 260° C. The polymer resin should have good heat resistance properties to the reflow process and should not blister or otherwise deteriorate when subjected to the welding conditions.

During use, the LED also generates heat which is absorbed by the reflector. In the past few years, the amount of heat generated by the LED has increased as the LED element power has increased. When subjected to heat during welding and/or heat during use, the reflectance properties of the polymer resin should not deteriorate. In the past, for instance, exposure to high temperatures and/or repeated heating and cooling during use have caused polymer resins to yellow. Yellowing causes the whiteness index of the resin to lower. Yellowing is especially a problem for LEDs that emit blue light since yellow surfaces have a tendency to absorb light in the blue wavelength range.

In addition to the above, the reflector is generally a thin small part and requires satisfactory mechanical strength. Thus, reflectors should also have sufficient impact strength to avoid breakage during assembly of the LED and during use of the LED.

In U.S. Patent Publication No. 2007/0213458 entitled "Light-Emitting Diode Assembly Housing Comprising Poly (cyclohexanedimethanol terephthalate) Compositions", a reflector for an LED is disclosed that is made from a poly(cyclohexanedimethanol terephthalate) (hereinafter "PCT") composition. The '458 application, which is incorporated herein by reference, has made great advances in design and function of LEDs. The present disclosure, however, is directed to further improvements.

SUMMARY

In general, the present disclosure is directed to a molded reflector for a light source, such as a light-emitting diode. The present disclosure is also directed to a polymer composition for producing the molded reflector.

As will be described in greater detail below, the polymer composition of the present disclosure is formulated so as to have not only high reflectance properties but also a combination of good molding processability and melt flow properties during injection molding. In particular, it was discovered that various polymer compositions used in LED components become yellow due to thermal aging resulting in a lower reflectance value and whiteness index. In particular, it was discovered that various compositions used in LED components present problems such as sticking, short shots, and flash during injection molding. The present disclosure overcomes the above disadvantages.

In one embodiment, for instance, the present disclosure is directed to a molded reflector surrounding a light-emitting source. The reflector is molded from a polymeric material. The polymeric material is comprised of poly(1,4-cyclohexanedimethanol terephthalate), a white pigment, a silicone compound, and a nucleating agent. In accordance with the present disclosure, a silicone compound and a nucleating agent not only improve the molding processability of the PCT composition but also provide a PCT composition with excellent reflectance stability under high temperatures. In this regard, the silicone compound may comprise a polysiloxane and the nucleating agent may comprise a metal salt of an organic acid.

As described above, the polymeric material contains a silicone compound. In one embodiment, the silicone compound may comprise a polysiloxane. Polysiloxanes that may be present in the composition include polydimethylsiloxane, polydiphenylsiloxane, polyalkylmethylsiloxane, polydimethylsiloxane-diphenylsiloxane copolymer, alkylmethylsiloxane-arylalkylmethylsiloxane copolymer, poly(3,3,3-trifluoropropylmethylsiloxane), 3,3,3-trifluoropropylmethylsiloxane-dimethylsiloxane copolymer, or mixtures thereof. The polysiloxanes that may be present in the composition also include terminally functionalized polysiloxanes. In one embodiment, the silicone compound is an ultra-high molecular weight polysiloxane predispersed in a thermoplastic polyester. The silicone compound can be present in the polymeric material in an amount of from about 0.1% to about 5% by weight.

As described above, the polymeric material contains a nucleating agent. In one embodiment, the nucleating agent may comprise a metal salt of an organic acid. The metal salt may include sodium, lithium, potassium, calcium, magnesium, barium, aluminum, zinc, titanium zirconium, or mixtures thereof. The organic acid may include aliphatic carboxylic acids, aromatic carboxylic acids, fatty acids, montanic acids, polymeric aliphatic carboxylic acids, or mixtures thereof. In one embodiment, nucleating agents are comprised of sodium benzoate, sodium stearate, calcium stearate, zinc stearate, or mixtures thereof. In one particular embodiment, the nucleating agent may comprise sodium stearate. The nucleating agent can be present in the polymeric material in an amount of from about 0.1% to about 5% by weight.

As described above, the polymeric material contains a white pigment. In one embodiment, the white pigment may comprise titanium dioxide. The white pigment can be present in the polymeric material in an amount of from about 2% to about 40% by weight.

In addition to a PCT resin, a white pigment, a silicone compound, and a nucleating agent, the polymeric material can also contain various other ingredients and components in various amounts. In one embodiment, for instance, the polymeric material can further contain an inorganic filler. In one particular embodiment, the polymeric material contains from about 40% to about 80% by weight of the PCT polymer, from about 1% to about 40% by weight of the inorganic filler, from about 2% to about 40% by weight of the white pigment, from about 0.1% to about 5% by weight of the silicone compound, and from about 0.1% to about 5% by weight of the nucleating agent.

In accordance with the present disclosure, the polymeric material used to form the molded reflector can have an initial reflectance at 460 nm of greater than about 90%, such as greater than about 92%, such as even greater than about 94%. The initial reflectance at 460 nm is generally less than 100%. The polymeric material can also have a reflectance at 460 nm after aging at 170° C. for 200 hours of still greater than about 75%, such as greater than about 80%, such as greater than about 85%, such as even greater than about 88%. In general, the reflectance at 460 nm after aging at 170° C. for 200 hours is less than the initial reflectance at 460 nm and is generally less than about 100%, such as less than about 95%. The polymeric material can also have a reflectance at 460 nm after aging at 170° C. for 500 hours of still greater than about 60%, such as greater than about 65%, such as greater than about 74%, such as greater than about 80%, such as even greater than about 82%. In general, the reflectance at 460 nm after aging at 170° C. for 500 hours is less than the initial reflectance at 460 nm of the material and is generally less than about 100%, such as less than about 90%.

In accordance with the present disclosure, the molded reflector molded from the composition of the present disclosure can also have an improved demolding performance, filling performance, and part quality performance.

The polymeric material used to form the molded reflector not only has good melt flow properties and molding processability but also has a high reflectance value and is resistant to yellowing.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Figure 1:
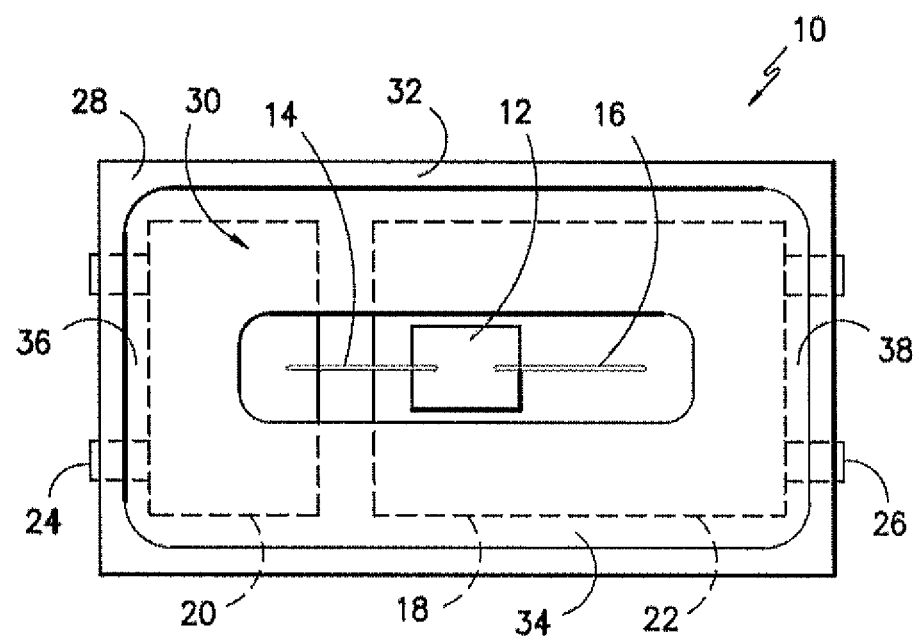
FIG. 1 is a perspective view of one embodiment of an LED assembly made in accordance with the present disclosure.

Repeat use of reference characters in the present specification and drawings is intended to represent the same or analogous features or elements of the present invention.

DETAILED DESCRIPTION

It is to be understood by one of ordinary skill in the art that the present discussion is a description of exemplary embodiments only and is not intended as limiting the broader aspects of the present disclosure.

In general, the present disclosure is directed to a polymer composition and to articles made from the composition that can exhibit various properties that relate to reflectance, whiteness, flow properties during melt processing and/or mechanical properties such as impact strength. The composition of the present disclosure can be used in numerous and different end use applications. For instance, the composition can be used as a reflector for light. For example, the polymer composition may be used to produce a reflector for LED assemblies, may be used as a component in a sign, such as a lighted sign, may be used as a label or in any other suitable application where high light reflectance properties are desired.

The polymer composition of the present disclosure generally contains a polymer resin, a silicone compound comprising a polysiloxane, and a nucleating agent comprising a metal salt of an organic acid. Optionally, the composition can also contain one or more reinforcing agents, such as a filler or fibers, a white pigment, various other light stabilizers, an antioxidant, a lubricant, and an optical brightener.

More particularly, the polymer composition may contain poly(1,4-cyclohexanedimethanol terephthalate) as the polymer resin combined with a silicone compound and a nucleating agent. In one embodiment, the silicone compound may comprise a polysiloxane and the nucleating agent may comprise a metal salt of an organic acid. The silicone compound and nucleating agent assist in providing optimum molding processability and optimum viscosity of the composition during melt flow applications, such as during injection molding, and optimum reflectance stability at high temperatures. In particular, the silicone compound impacts the adhesive characteristics of the composition and the molding processability properties. In particular, the nucleating agent impacts the polymer microstructure by providing sites around which the polymer chains can crystallize thereby affecting the thermal and mechanical properties of the composition as well as the melt flow properties.

Of particular advantage, the present inventors discovered that the PCT composition with a silicone compound and a nucleating agent exhibits excellent reflectance stability, especially when the composition is used as a reflector for a light source, in combination with excellent molding processability and stable viscosity for melt flow applications.

Polymer compositions formulated in accordance with the present disclosure can be injection molded for forming various articles, such as reflectors. Molded articles made in accordance with the present disclosure may be used, for instance, as a reflector in a LED assembly, particularly for LED assemblies that emit white light. The reflector may be in the form of a single piece or may be formed by assembling two or more sub-parts. When the reflector is in the form of a single piece, the reflector can be prepared from the polymer composition only. When formed from two or more sub-parts, on the other hand, one or more of the sub-parts may be metal, ceramic or the like. The polymer composition can be molded over a metal or other polymeric part.

In one embodiment, a reflector is made in accordance with the present disclosure that defines a cavity that is intended to surround a light-emitting diode. The reflector reflects the light emitted by the LED in an outward direction and through a lens. The cavity may have a cylindrical shape, conical shape, parabolic shape, or any other suitable shape. Alternatively, the cavity may have walls that are parallel or substantially parallel to the light-emitting diode. An encapsulant may be formed over the cavity and may comprise an epoxy or silicone material.

The reflector housings of the present disclosure may be used in numerous and diverse applications. As described above, the housings are particularly well suited for use in LED assemblies. Such LED assemblies, for instance, may be incorporated into traffic signal lights, display backlights for computer monitors, televisions and the like, cellular telephone displays, automotive displays, automotive headlamps, flashlights, interior lighting, street lights, exterior lighting, and the like. In addition to being used with LED assemblies, the housings and reflectors of the present disclosure may also be incorporated into other light-emitting devices or in any application where reflective properties are needed.

The polymer composition of the present disclosure also has a relatively high initial reflectance and excellent reflectance stability. For instance, once molded into an article, the polymer material of the present disclosure can have an initial reflectance at 460 nm of greater than about 90%, such as greater than about 92%, such as even greater than about 94%. Reflectance is measured according to ASTM Test Method 1331 using a spectracolormeter. During testing, a CIE D65 daylight illuminant is used at an angle of 10°.

Of particular advantage, articles made according to the present disclosure also have excellent reflectance stability properties. For instance, after aging at 170° C. for 200 hours, the reflectance at 460 nm of articles made according to the present disclosure can be at least about 75%, such as at least about 80%, such as at least about 85%, such as at least about 88%. For instance, after aging at 170° C. for 500 hours, the reflectance at 460 nm of articles made according to the present disclosure can be at least about 60%, such as at least about 65%, such as at least about 74%, such as at least about 80%, such as at least about 82%. The reflectance after aging is generally lower than the initial reflectance.

In addition to the initial reflectance, polymer articles made according to the present disclosure can also have a relatively high initial whiteness index. Whiteness index can be measured according to WI E313.

Figure 2:
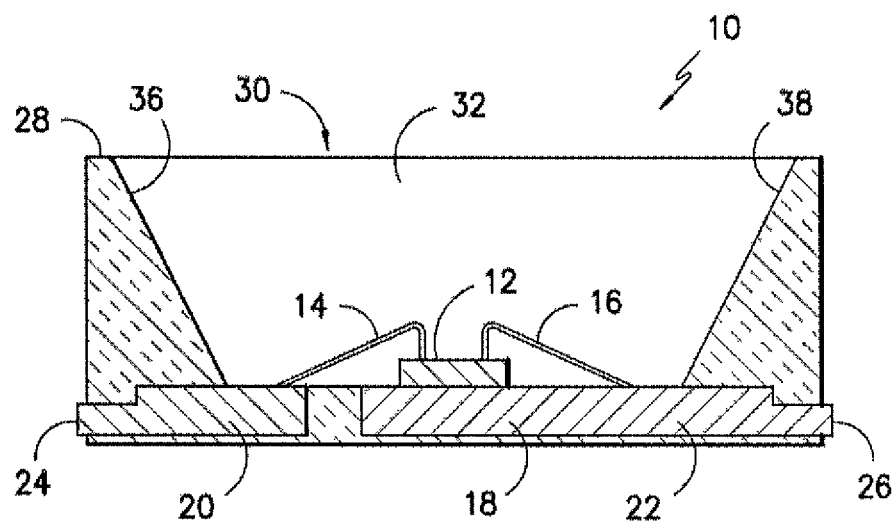
FIG. 2 is a plan view of the LED assembly illustrated in FIG. 1.

Referring to FIGS. 1 and 2, one embodiment of an LED assembly 10 that may be made in accordance with the present disclosure is shown. In the embodiment illustrated in FIGS. 1 and 2, the LED assembly 10 is considered a side view LED. As shown, the LED assembly 10 includes a light-emitting diode 12 that is configured to emit light when a current is fed through the device. The light-emitting diode 12, for instance, may be comprised of a semiconductor chip including multiple layers of materials. The LED 12 generally includes an n-type material layer and a p-type material layer, which form a p-n junction that can be connected to a voltage source. In one embodiment, for instance, the p-type layer may comprise doped gallium aluminum arsenide, while the n-type layer may comprise doped gallium arsenide.

The LED 12 is connected to a first bonding wire 14 and to a second bonding wire 16. The bonding wires 14 and 16 are connected to a lead frame 18. The lead frame 18 includes a first lead frame portion 20 and a second lead frame portion 22. The lead frame 18 may include or be connected to an anode 24 and a cathode 26 which may also be considered a first terminal 24 and a second terminal 26.

In accordance with the present disclosure, the LED assembly 10 further includes a reflector 28 which can also serve as the housing for the LED assembly. The reflector 28, in accordance with the present disclosure, is made from a polymer composition having excellent reflectance properties.

As shown in FIGS. 1 and 2, the reflector 28 defines a cavity 30 in which the LED 12 is located. The walls of the cavity 30 generally surround the LED 12 and, in the embodiment illustrated, have a depth sufficient for the LED 12 to be recessed within the cavity.

The cavity 30 of the reflector 28 surrounds the LED 12 and serves to reflect light being emitted by the LED in an outward direction. The cavity 30 may have any suitable shape. For instance, the cavity 30 may be cylindrical, conical, parabolic, or any other suitable curved form. Alternatively, the walls of the cavity 30 may be parallel, substantially parallel, or tapered with respect to the diode 12. In the embodiment illustrated in FIG. 1, for instance, the cavity 30 has a smooth surface and is comprised of side walls 32 and 34 and end walls 36 and 38. The side walls 32 and 34 taper in an outward direction from the LED 12. The end walls 36 and 38, on the other hand, can be substantially parallel or may also taper outwardly from the LED source.

If desired, the cavity 30 of the reflector 28 may be filled with a clear material, such as a transparent material or a translucent material. For instance, the cavity 30 may be filled with an epoxy or a silicone material. In one embodiment, the material used to fill the cavity 30 may act as a lens for the light being emitted by the LED 12.

Figure 3:
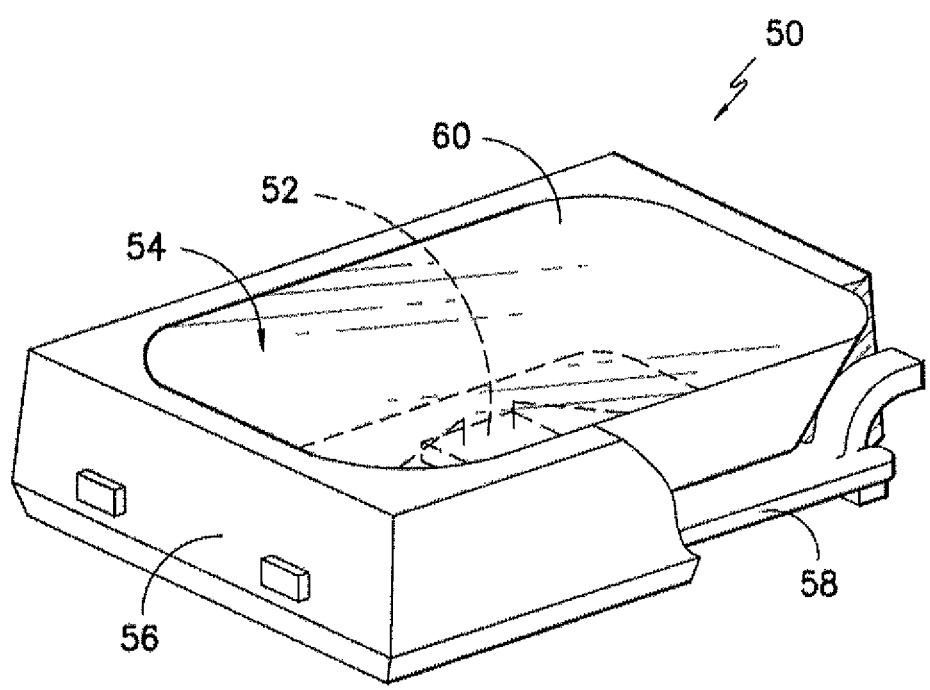
FIG. 3 is a perspective view of another embodiment of an LED assembly made in accordance with the present disclosure.

Referring to FIG. 3, another embodiment of an LED assembly 50 that may be made in accordance with the present disclosure is shown. In the embodiment illustrated in FIG. 3, a top view LED assembly is shown. The top view LED assembly 50 is similar in construction to the side view LED assembly 10 illustrated in FIGS. 1 and 2.

For instance, the top view LED assembly 50 includes an LED 52 that is positioned towards the bottom of a cavity 54 of a reflector 56. The LED 52 is also connected to a lead frame 58. In the embodiment illustrated in FIG. 3, the cavity 54 of the reflector 56 is filled with a clear material 60.

LED assemblies as shown in FIGS. 1-3 generally have relatively small dimensions. For example, the LED assemblies typically have a greatest dimension (such as height, width, depth or diameter) that is generally less than about 10 mm, such as typically less than about 8 mm. The LED assemblies typically include at least one dimension, such as depth, that is less than 5 mm, such as less than 2 mm, such as even less than 1 mm. As will be described below, the polymer composition of the present disclosure is capable of forming reflectors for LED assemblies using melt flow processing techniques. For instance, in one embodiment, the polymer composition of the present disclosure is injection molded in forming the reflectors. Of particular advantage, the composition of the present disclosure is formulated so as to have melt flow properties capable of forming hundreds of reflectors simultaneously.

The polymer composition of the present disclosure contains one or more polymer resins in addition to a silicone compound, nucleating agent, and a white pigment. The polymer resin generally comprises a polyester polymer. In other embodiments, however, the polymer resin may comprise a liquid crystal aromatic polyester polymer, a polycarbonate polymer, or mixtures thereof. Particular polymer resins that may be used include polyethylene terephthalate, polypropylene terephthalate, polybutylene terephthalate, polyethylene naphthalate, polybutylene naphthalate, aliphatic polyesters such as polyester glutarate, and the like.

In general, any suitable thermoplastic polymer may be included in the polymer composition. In one embodiment, thermoplastic polymers having a high melting temperature, such as greater than about 260° C. are used. In addition to the above polymers, other polymers that may be used include high temperature polyimide polymers, such as nylon 66, nylon 3, nylon 4, nylon 5, nylon 46, and the like. Still other polymers that may be used include liquid crystal polyester polymers, polytetrafluoroethylene polymers, fluorinated ethylene polymers, and the like.

As described above, the polymer composition of the present disclosure contains a poly(1,4-cyclohexanedimethanol terephthalate) polymer, which is typically referred to as a "PCT" polymer. Poly(1,4-cyclohexanedimethanol terephthalate) is a polyester that contains repeat units from a dicarboxylic acid component and a glycol component. At least about 80 mol percent, more preferably at least about 90 mol percent, and especially preferably all of the diol repeat units are derived from 1,4-cyclohexanedimethanol and are of formula (I).

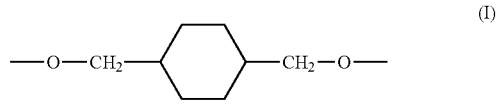

At least about 80 mol percent, more preferably at least about 90 mol percent, and especially preferably all of the dicarboxylic acid repeat units are derived from terephthalic acid and are of formula (II).

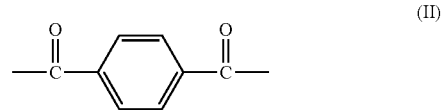

In one embodiment, the PCT polymer contains 100 mol percent of terephthalic acid or diesters. The glycol component, on the other hand, can contain a total of 100 mol percent 1,4-cyclohexanedimethanol.

In various embodiments, however, the dicarboxylic acid component may contain up to 10 mol percent of other aromatic, aliphatic, or alicyclic dicarboxylic acids such as isophthalic acid, naphthalenedicarboxylic acid, cyclohexanedicarboxylic acid, succinic acid, subacic acid, adipic acid, glutaric acid, azelaic acid, and the like.

The glycol component may also contain up to about 10 mol percent of other aliphatic or alicyclic glycols, such as diethylene glycol, triethylene glycol, ethylene glycol, propanediol, butanediol, pentanediol, hexanediol, and the like.

The PCT polymer can have an inherent viscosity (I.V.) of from about 0.3 to about 1.5 and a melting point of at least 260° C.

In one embodiment, the PCT polymer can comprise a blend of two or more different grades of PCT polymers. For instance, in one embodiment, a blend, such as a 1:1 blend, of high I.V. PCT polymer with a low I.V. PCT polymer may be used. In an alternative embodiment, a blend, such as a 2:1 blend, may be used that includes a PCT polymer wherein the dicarboxylic acid component is 100 mol percent terephthalic acid and a PCT polymer in which the dicarboxylic acid component is 90 mol percent terephthalic acid and 10 mol percent isophthalic acid.

In general, the PCT polymer is present in the composition in an amount of at least about 40% by weight, such as in an amount of at least about 50% by weight, such as in an amount of at least 60% by weight, such as in an amount of at least 70% by weight, such as in an amount of at least 80% by weight. The PCT polymer is generally present in an amount less than about 90% by weight, such as in an amount less than about 80% by weight, such as in an amount less than about 70% by weight. In one embodiment, a PCT polymer is present in an amount of from about 40% by weight to about 80% by weight. In an alternate embodiment, a PCT polymer is present in an amount of from about 50% by weight to about 70% by weight.

In accordance with the present disclosure, the composition further contains at least one silicone compound. A silicone compound comprises a material capable of improving the adhesive properties of the composition, in particular, for molding processability. In one embodiment, the silicone compound is a polysiloxane with a number average molecular weight of at least 1000, such as at least 10,000. Polysiloxanes that may be present in the composition include polydimethylsiloxane, polydiphenylsiloxane, polyalkylmethylsiloxane, polydimethylsiloxane-diphenylsiloxane copolymer, alkylmethylsiloxane-arylalkylmethylsiloxane copolymer, poly(3,3,3-trifluororopropylmethylsiloxane), 3,3,3-trifluoropropylmethylsiloxane-dimethylsiloxane copolymer, or mixtures thereof. The polysiloxanes that may be present in the composition also include terminally functionalized polysiloxanes. In one embodiment, the silicone compound is a polysiloxane predispersed in a thermoplastic polyester. In one particular embodiment, the silicone compound is an ultra-high molecular weight polysiloxane predispersed in a thermoplastic polyester wherein the ultra-high molecular weight polysiloxane is present in an amount of about 50% by weight of the dispersion and the thermoplastic polyester is present in an amount of about 50% by weight of the dispersion. In general, the silicone compound is present in the composition in an amount of from about 0.1% to about 5% by weight, such as from about 0.2% to about 3% by weight.

In accordance with the present disclosure, the composition further contains at least one nucleating agent, A nucleating agent comprises a material capable of providing sites around which the polymer chains can crystallize. The polymer microstructure can impact the thermal and mechanical properties as well as the melt flow properties of the composition. In one embodiment, the nucleating agent is a metal salt of an organic acid. The metal salt may include sodium, lithium, potassium, calcium, magnesium, barium, aluminum, zinc, titanium zirconium, or mixtures thereof. The organic acid may include aliphatic carboxylic acids, aromatic carboxylic acids, fatty acids, montanic acids, polymeric aliphatic carboxylic acids, or mixtures thereof. In one embodiment, the nucleating agent that is comprised of a metal salt of an organic acid may include sodium benzoate, sodium stearate, calcium stearate, zinc stearate, or mixtures thereof. In one particular embodiment, the nucleating agent may comprise sodium stearate. In general, the nucleating agent is present in the composition in an amount of from about 0.1% to about 5% by weight, such as from about 0.2% to about 3% by weight.

In accordance with the present disclosure, the composition also contains at least one white pigment in amounts greater than 1% by weight, such as in amounts of at least about 2% by weight, such as in amounts of at least 10% by weight, such as in amounts of at least 15% by weight. The white pigment is present in the composition in an amount sufficient to increase the reflectance of articles molded from the composition. White pigments that may be included in the composition include titanium dioxide, zinc oxide, white lead, aluminum oxide, barium sulfate, and the like.

In one embodiment, the white pigment comprises titanium dioxide. The titanium dioxide may be of any sort, such as a rutile titanium dioxide. The titanium dioxide particles can have any suitable shape, such as spherical particles or elliptic particles. The titanium dioxide powder can be comprised of particles having a diameter of from about 10 nm to about 20,000 nm, such as from about 150 nm to about 500 nm.

In one embodiment, the titanium dioxide particles can be coated. For example, the titanium dioxide particles can be first coated with an inorganic coating and then optionally with an organic coating that is applied over the inorganic coating. Inorganic coatings that may be used include metal oxides. Organic coatings may include carboxylic acids, polyols, alkanolamines, and/or silicon compounds.

Examples of carboxylic acids suitable for use as an organic coating include adipic acid, terephthalic acid, lauric acid, myristic acid, palmitic acid, stearic acid, polyhydroxystearic acid, oleic acid, salicylic acid, malic acid, and maleic acid. As used herein, the term "carboxylic acid" includes the esters and salts of the carboxylic acids.

Examples of silicon compounds suitable for an organic coating include, but are not limited to, silicates, organic silanes, and organic siloxanes, including organoalkoxysilanes, aminosilanes, epoxysilanes, mercaptosilanes, and polyhydroxysiloxanes. Suitable silanes can have the formula $R_xSi(R')_{4-x}$ wherein R is a nonhydrolyzable aliphatic, cycloaliphatic, or aromatic group having from 1 to about 20 carbon atoms, and R' is one or more hydrolyzable groups such as an alkoxy, halogen, acetoxy, or hydroxy group, and X is 1, 2, or 3.

Useful suitable silanes suitable for an organic coating include one or more of hexyltrimethoxysilane, octyltriethoxysilane, nonyltriethoxysilane, decyltriethoxysilane, dodecyltriethoxysilane, tridecyitriethoxysilane, tetradecyltriethoxysilane, pentadecyltriethoxysilane, hexadecyltriethoxysilane, heptadecyltriethoxysilane, octadecyltriethoxysilane, N-(2-aminoethyl) 3-aminopropylmethyldimethoxysilane, N-(2-aminoethyl) 3-aminopropyltrimethoxysilane, 3-aminopropyltriethoxysilane, 3-glycidoxypropyltrimethoxysilane, 3-glycidoxypropylmethyldimethoxysilane, 3-mercaptopropyltrimethoxysilane and combinations of two or more thereof. In other useful silanes, R has between 8 and 18 carbon atoms and R' is one or more of chloro, methoxy, ethoxy, or hydroxy groups.

In one embodiment, the white pigment may comprise Type II chalk resistance particles as classified according to ASTM Test D476. For example, in one embodiment, the white pigment may comprise titanium dioxide particles that include a surface treatment that produces the chalk resistance properties. For instance, in one embodiment, the titanium dioxide may include a surface treatment containing alumina. The white pigment may have a neutral that or have a blue tint.

One or more white pigments may be present in the composition in an amount of at least about 1% by weight, such as in an amount of at least about 2% by weight, such as in an amount of at least about 5% by weight, such as in an amount of at least about 10% by weight, such as in an amount of at least about 15% by weight, such as in an amount of at least about 20% by weight, such as in an amount of at least about 25% by weight. The white pigments may be present in the composition generally in an amount less than about 50% by weight, such as in an amount less than about 40% by weight.

The polymer composition of the present disclosure can also optionally contain one or more reinforcing agents, such as fillers and fibers. Such materials can include, for instance, glass fibers, wollastonite, potassium titanate, calcium carbonate, talc, mica, silica, silicate, kaolin, and the like. Such inorganic fillers may be present in the composition in an amount of from about 1% to about 40% by weight, such as in an amount of from about 10% to about 30% by weight.

The composition may further contain one or more reactive viscosity stabilizers. A reactive viscosity stabilizer comprises a material capable of not only reacting with end groups on the PCT polymer but also capable of stabilizing the viscosity of the PCT polymer in a manner that prevents the viscosity from fluctuating during melt processing. The reactive viscosity stabilizer can also serve to compatibilize the PCT composition.

In one embodiment, the reactive viscosity stabilizer comprises a material that can react with carboxyl or hydroxyl end groups on the PCT polymer. In this manner, the reactive viscosity stabilizer may act as a chain extender.

Reactive viscosity stabilizers that may be used in accordance with the present disclosure generally include phenoxy resins and/or non-aromatic epoxy resins. In one embodiment, for instance, the reactive viscosity stabilizer comprises a modified phenoxy resin that is capable of reacting with the PCT polymer. The phenoxy resin, for instance, may include hydroxyl functionality. The phenoxy resin, for instance, may have a glass transition temperature of less than about 120° C., such as less than about 110° C., such as less than about 100° C. The phenoxy resin may have a viscosity when tested in cyclohexanone at 25% NV of less than about 2500 cP, such as less than about 2300 cP.

Non-aromatic epoxy resins that may be used as the reactive viscosity stabilizer include 3,4-epoxycyclohexenylmethyl-3',4'-epoxycyclohexene carboxylate, 1,4-cyclohexane dimethanoldigrycicdyl ether, hydrogenated bis-phenol-A type epoxy resin and/or tris(2,3-epoxypropyl) isocyanurate. In general, any suitable alicyclic epoxy resin may be used.

In addition to the above reactive viscosity stabilizers or instead of the above reactive viscosity stabilizers, the composition may contain an epoxy-functional copolymer as the reactive viscosity stabilizer. Exemplary copolymers having multiple epoxy pendant groups include the reaction products of one or more ethylenically unsaturated monomers (e.g. styrene, ethylene, and the like) with an epoxy-containing ethylenically unsaturated monomer (e.g., glycidyl C1-4 (alkyl) acrylate, ally glycidyl ethacryalte, and glycidyl itoconate). For example, in one embodiment the epoxy-functional copolymer is a styrene-acrylic copolymer (including an oligomer) containing glycidyl groups incorporated as side chains.

As described above, the reactive stabilizer incorporated into the composition may comprise any material that can react with carboxyl or hydroxyl end groups on the thermoplastic polymer without causing yellowing, especially after thermal aging. In one embodiment, the reactive stabilizer may comprise an anhydride. Examples may include pyromellitic dianhydride, trimellitic anhydride, 3-(triethoxysilyl) propylsuccinic anhydride, and the like. Other reactive additives can include various oxazolines and/or silanes. Such reactive additives can include phenylenebisoxazoline and 3-aminopropyltriethoxysilane.

In general, the one or more reactive viscosity stabilizers are present in the composition in an amount sufficient to stabilize the viscosity of the composition during melt processing without causing viscosity fluctuations. In general, the reactive viscosity stabilizers are present in the composition in an amount of from about 0.2% to about 8% by weight, such as from about 0.5% to about 5% by weight.

The composition of the present disclosure may further contain one or more impact modifiers. The impact modifiers can be reactive with the PCT polymer or non-reactive. In one embodiment, for instance, the composition contains at least one reactive impact modifier and at least one non-reactive impact modifier.

Reactive impact modifiers that may be used include ethylene-maleic anhydride copolymers, ethylene-alkyl (meth)acrylate-maleic anhydride copolymers, ethylene-alkyl(meth)acrylate-glycidyl(meth)acrylate copolymers, and the like. For instance, a reactive impact modifier may comprise a random terpolymer of ethylene, methylacrylate, and glycidyl methacrylate. The terpolymer can have a glycidyl methacrylate content of from about 5% to about 20%, such as from about 6% to about 10%. The terpolymer may have a methylacrylate content of from about 20% to about 30%, such as about 24%.

In general, a reactive impact modifier may be present in the composition in an amount of from about 0.05% to about 10% by weight, such as in an amount of from about 0.1% to about 5% by weight.

Non-reactive impact modifiers that may be blended into the polymer composition of the present disclosure generally include various rubber materials, such as acrylic rubbers, ASA rubbers, diene rubbers, organosiloxane rubbers, EPDM rubbers, SBS or SEBS rubbers, ABS rubbers, NBS rubbers, and the like. For instance, an ethylene acrylic rubber may comprise an ethylene acrylic ester copolymer. Particular examples of non-reactive impact modifiers include ethylene butylacrylate, ethylene(methyl)acrylate, or 2 ethyl hexyl acrylate copolymers. An ethylene(methypacrylate copolymer may have a (methyl)acrylate content of from about 20% to about 30% by weight, such as in an amount of about 24% by weight.

The composition of the present disclosure may also include a combination of an ethylene(methypacrylate copolymer combined with a terpolymer of ethylene, (methyl)acrylate and glycidyl(meth)acrylate.

In one particular embodiment, the impact modifier may comprise a core-shell polymer wherein the core contains an acrylate rubber comprised of a $C_4$-$C_{12}$ acrylate and wherein at least one shell is comprised of a vinyl aromatic compound, a vinyl cyanide, an alkyl(meth)acrylate, or (meth) acrylic acid. In one particular embodiment, the shell may be comprised of methyl(meth)acrylate.

When present in the composition, non-reactive impact modifiers can be included in an amount of from about 0.05% to about 10% by weight, such as in an amount of from about 0.1% to about 5% by weight.

The polymer composition of the present disclosure may contain various other thermoplastic polymers in addition to the PCT polymer. The other thermoplastic polymers can be present in an amount of from about 0.05% to about 20% by weight, such as in an amount of from about 0.5% to about 10% by weight. Other thermoplastic polymers that may be included include other polyester polymers, a liquid crystal polymer, or mixtures thereof. Other thermoplastic polyester polymers that may be included in the composition include poly(ethylene terephthalate), polypropylene terephthalate), poly(butylene terephthalate), acid-modified PCT copolyesters, poly(ethylene naphthalate), poly(butylene naphthalate), aliphatic polyesters such as polyester glutarate, and the like. The inclusion of small amounts of other polyester polymers or a liquid crystal polymer may, in some embodiments, improve the processability of the composition. In one embodiment, for instance, the composition may contain an aromatic liquid crystal polyester polymer in an amount of from about 0.05% to about 20% by weight.

Another additive that may be present in the polymer composition is a polytetrafluoroethylene polymer. Inclusion of a polytetrafluoroethylene polymer may enhance the reflectance and the whiteness index of articles made from the polymer composition. The polytetrafluoroethylene polymer may be added to the composition in the form of a fine powder having an average particle size of less than about 50 microns, such as less than about 10 microns. In one embodiment, for instance, the polytetrafluoroethylene powder may have an average particle size of from about 1 micron to about 8 microns. The polytetrafluoroethylene polymer may be present in the composition in an amount of from about 0.05% to about 10% by weight, such as from about 0.1% to about 6% by weight.

In one embodiment, the polymer composition can also include a lubricant. The lubricant may comprise, for instance, a polyethylene wax, an amide wax, a montanic ester wax, a polyol ester, or the like. A lubricant, in certain embodiments, for instance, may comprise a polyethylene glycol-dilaurate and/or a neopentyl glycol dibenzoate. The lubricant may comprise an oxidized polyethylene wax. The polyethylene wax may have a density of from about 0.94 g/cm$^3$ to about 0.96 g/cm$^3$. In one embodiment, the lubricant may comprise a polyol ester. Suitable polyol esters include those esters prepared from neopentyl glycols, trimethylolpropanes, pentaerythritols, dipentaerythritols. In one particular embodiment, the polyol ester may be comprised of pentaerythrityl tetrastearate. When present, the lubricant may be included in the composition in an amount of from about 0.05% to about 5% by weight, such as in an amount of from about 0.1% to about 3% by weight.

In addition to the above, the polymer composition may contain various other additives and ingredients. For instance, the composition may contain various thermal and oxidative stabilizers, ultraviolet light stabilizers, optical brighteners, and the like.

The polymer composition of the present disclosure may contain antioxidant stabilizers. The antioxidant stabilizer can be present in an amount of from about 0.05% to about 5% by weight, such as in an amount of from about 0.1% to about 3% by weight. Inclusion of an antioxidant stabilizer may enhance thermal and oxidative stability. The antioxidant stabilizers that may be present include hydrogen donors such as secondary amines and sterically hindered phenols and hydroperoxide decomposers such as phosphites and phosphonites. In one embodiment, the antioxidant stabilizer includes a phosphonate, a phosphate, or mixtures thereof. Phosphonates that may be present include phenyl phosphonates and benzyl phosphonates, such as diethyl1-phenyl ethyl phosphonate, diethyl 2-phenyl ethyl phosphonate, diethyl benzyl phosphonate, or mixtures thereof. Phosphates that may be present include triphenyl phosphate, tributyl phosphate, tricresyl phosphate, 2-ethylhexyl diphenyl phosphate, cresyl diphenyl phosphate, oligomeric ethyl ethylene phosphate, bisphenol A bis(diphenyl phosphate), resorcinol bis(diphenyl phosphate), or mixtures thereof. Other stabilizers that may be present include commercially available stabilizers such as Irganox 1076, Irganox 1135, Irganox 259, Irganox 1098, Irganox 245, Irganox 1425, Irganox 1330, Irganox 3125, Irganox 3114, Irganox 1010, Irgafos 168, Ultranox 626, Irgafos P-EPQ, Weston 618, Tinuvin 770, Chimassorb 944, Hostavin N 20, Hostavin N 24, Hostavin N 30, Cyasorb UV-3346, Cyasorb UV-3638, Tinuvin 622, Tinuvin 360, Tinuvin 1577, and Tinuvin 1600.

In one embodiment, the polymer composition may contain ultraviolet light stabilizers. The ultraviolet stabilizer can be present in an amount of from about 0.05% to about 5% by weight, such as in an amount of from about 0.1% to about 3% by weight. Inclusion of ultraviolet light stabilizers may enhance ultraviolet light stability and reduce degradation effects caused by ultraviolet light. In one embodiment, the polymer composition may contain a sterically hindered amine light stabilizer. When present in the composition, hindered amine light stabilizers have been found to provide various advantages and benefits. For instance, sterically hindered amine light stabilizers have been found to further improve the reflectance properties of the material, especially after long term aging. In one particular embodiment, a hindered amine light stabilizer may be used in conjunction with a hindered phenolic antioxidant and a phosphite stabilizer.

In one embodiment, the polymer composition may contain an optical brightener. The optical brightener can be present in an amount of from about 0.01% to about 4% by weight, such as in an amount of from about 0.02% to about 2% by weight. Inclusion of optical brighteners may enhance reflectance and whiteness properties of the composition. The optical brighteners generally include fluorescent agents. In one embodiment, the optical brightener is an optical brightener that is stable at high temperatures. For instance, in one particular embodiment, the optical brightener may include a benzoxazole.

In order to produce articles in accordance with the present disclosure, the polymer composition, in one embodiment, can comprise a melt-mixed blend, wherein all of the polymeric components are well-dispersed within each other and all of the non-polymeric ingredients are well-dispersed in and bound by the polymer matrix, such that the blend forms a unified whole.

Any melt-mixing method may be used to combine the polymeric components and non-polymeric ingredients. For example, in one embodiment, the polymeric components and the non-polymeric components may be added to a melt mixer, such as for example a single or twin-screw extruder, a blender, a kneader, or a Banbury mixer, either all at once through a single step addition, or in a stepwise fashion and then melt-mixed. When combining the different additives together, the polymeric components are typically first blended and melt-mixed. Subsequently, the non-polymeric additives are then blended with the mix.

The polymer composition can be formulated so as to have a desired melt viscosity. For instance, the polymer composition may have a melt viscosity at a shear rate of 1000/sec and at 305° C. of less than about 250 Pa·s, such as less than about 200 Pa·s, such as less than about 150 Pa·s. The melt viscosity is generally greater than about 30 Pa·s, such as greater than about 40 Pa·s, such as greater than about 50 Pa·s.

The blended composition can then be molded into any desired shape through any suitable molding process. For instance, in one embodiment, articles are formed through injection molding, During injection molding, the temperature of the composition may be from about 280° C. to about 350° C. The temperature of the molds, on the other hand, may be in a range of from about 80° C. to about 150° C.

In accordance with the present disclosure, the molded reflector molded from the composition of the present disclosure can have an improved demolding performance, filling performance, and part quality performance. The demolding performance characterizes the ease of demolding a molded part from a mold cavity. In particular, the demolding performance characterizes issues related to a molded part sticking to a mold cavity and to a molded part leaving residue in a mold cavity. The filling performance characterizes the ease of filling a mold cavity. In particular, the filling performance characterizes issues related to the injection pressure and a short shot where insufficient material is injected into the mold cavity. The part quality performance characterizes the excess material attached to a molded part typically caused by leakage of material between surfaces of a mold.

As described above, the PCT polymer composition of the present disclosure is particularly well suited for producing reflectors for LED assemblies. The reflectance properties of the polymer are particularly well suited for use with white LEDs. The LED reflector may be in the form of a single piece or may be formed from two or more subparts. In one embodiment, the polymer composition is injection molded over the lead frame as shown in FIGS. 1 and 2. In this manner, the lead frame and the reflector become integrated together. The semiconductor light-emitting diode chip can then be mounted within the cavity of the reflector and connected to the lead frame. The LED can be bonded to the lead frame using the bonding wires. The entire assembly can be encased or the cavity defined by the reflector can be filled with a core material such as a solid epoxy that can form a lens for focusing the light in a single direction.

LED assemblies made in accordance with the present disclosure can be used in numerous and different applications. For instance, the LED assemblies can be used in traffic signal lights, LCD displays, backlights, cellular telephones, automotive display lights, automotive headlamps, flashlights, interior lighting, streetlights, and in exterior lighting applications.

The present disclosure may be better understood with reference to the following examples.

EXAMPLE

The following examples are presented below by way of illustration and not by way of limitation.

Table 1 below lists various compositions that were prepared by melt compounding the components shown in the table using a 32 mm twin-extruder operating at about 300° C., using a screw speed of about 300 rpm and a melt temperature of from about 320° C. to about 330° C. Upon exiting the extruder, the compositions were cooled and pelletized.

The melt viscosity of pellet samples was determined for each composition using a capillary rheometer at 305° C. at a shear rate of 1000/sec. A lower melt viscosity generally indicates that the composition better fills the mold.

The compositions were molded into ISO tensile bars according to ISO Method 527-1/2 using a mold temperature of about 120° C. Tensile properties of the samples were determined using the test method above. Charpy impact strength was determined following ISO Test 179.

Reflectance at 460 nm was determined for each composition using ASTM Test Method E1331 using a CIE D65 daylight illuminant at 10° by a spectracolormeter DataColor 600. Measurements were done on the tensile bars. The aging test was carried out in a circulated oven at 170° C. A higher reflectance number indicates less absorption or loss of light.

The crystallization temperature was determined for each composition using differential scanning calorimetry which provided a crystallization peak during cooling.

To determine the LED reflector molding performance, the compositions were also molded to produce LED top view 7020 reflectors with lead frames using a 75-ton vertical injection molding machine. Molding occurred with a barrel temperature at about 305° C., an injection speed at about 300 mm/sec, a molding temperature at about 140° C., and a mold comprised of 96 cavities. The injection molding processability is evaluated by observing the demolding performance, filling performance, and part quality performance.

The demolding performance is rated from 1 to 5 where a higher rating generally indicates a better demolding performance than a lower rating. A rating of 1 generally indicates a strong mold sticking problem and difficulty for demolding. A rating of 2 generally indicates mold sticking and difficulty for demolding. A rating of 3 generally indicates some demolding problems. A rating of 4 generally indicates good demolding and very few demolding problems. A rating of 5 generally indicates excellent demolding and no demolding problems.

The filling performance is rated from 1 to 5 where a higher rating generally indicates a better filling performance than a lower rating. A rating of 1 generally indicates many short shots and difficulty filling all of the cavities. A rating of 2 generally indicates some short shots and difficulty filling all of the cavities. A rating of 3 generally indicates a few short shots at a high injection pressure. A rating of 4 generally indicates no short shots at a high injection pressure. A rating of 5 generally indicates no short shots at a low to normal injection pressure.

The part quality is rated from 1 to 5 where a higher rating generally indicates a better part quality performance than a lower rating. A rating of 1 generally indicates a lot of flashes on parts. A rating of 2 generally indicates some flashes on parts. A rating of 3 generally indicates a few flashes on parts. A rating of 4 generally indicates very few flashes on parts. A rating of 5 generally indicates no flashes on parts.

The following results were obtained:

| Components | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| PCT polymer | 64 | 60.6 | 60.5 | 60.3 | 60 | 59.5 | 58.5 | 59 | 58 | 58 | 58.1 |
| Chopped glass fiber | 16 | 16 | 16 | 16 | 16 | 16 | 16 | 16 | 16 | 16 | 16 |
| Titanium dioxide | 20 | 20 | 20 | 20 | 20 | 20 | 20 | 20 | 20 | 20 | 20 |
| Pentaerythrityl tetrastearate | | 0.6 | 0.6 | 0.6 | 0.6 | 0.6 | 0.6 | 0.6 | 0.6 | 0.6 | 0.6 |
| Phenolic antioxidant | | 0.3 | 0.3 | 0.3 | 0.3 | 0.3 | 0.3 | 0.3 | 0.3 | 0.3 | 0.3 |
| Triphenyl phosphate | | 0.5 | 0.5 | 0.5 | 0.5 | 0.5 | 0.5 | 0.5 | 0.5 | 0.5 | 0.5 |
| 50% by weight polysiloxane in 50% by weight thermoplastic polyester | | | | | | | 2 | 1 | 2 | 1 | 1 |
| Benzoxazole,2,2'-(1,2-ethenediyldi-4,1-phenylene)bis | | | 0.1 | 0.1 | 0.1 | 0.1 | 0.1 | 0.1 | 0.1 | 0.1 | |

-continued

| Components | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Sodium stearate | | | | 0.2 | 0.5 | 1 | | 0.5 | 0.5 | 0.5 | 0.5 |
| Talc | | 2 | 2 | 2 | 2 | 2 | 2 | 2 | 2 | 2 | 2 |
| Sodium aluminum silicate | | | | | | | | | | 1 | 1 |
| Total (weight %) | 100 | 100 | 100 | 100 | 100 | 100 | 100 | 100 | 100 | 100 | 100 |
| Properties | | | | | | | | | | | |
| MV1000 at 305° C. (Pa · s) | 102 | 97 | 87 | 78 | 60 | 52 | 85 | 56 | 66 | 52 | 56 |
| Tensile Modulus (MPa) | 5862 | 6575 | 6812 | 6733 | 7013 | 7599 | 6953 | 6962 | 6961 | 6988 | 7026 |
| Tensile Strength (MPa) | 68 | 61 | 65 | 67 | 62 | 51 | 67 | 64 | 69 | 68 | 62 |
| Elongation at Break | 0.9 | 1.2 | 1.2 | 1.2 | 1.1 | 0.8 | 1.2 | 1.2 | 1.2 | 1.2 | 1.2 |
| Charpy Impact Unnotched (kJ/m$^2$) | 18 | 20 | 22 | 20 | 18 | 9 | 19 | 20 | 22 | 20 | 18 |
| Crystallization Temperature (° C.) | 245 | 249 | 250 | 252 | 257 | 258 | 250 | 257 | 257 | 257 | 257 |
| Initial Reflectance at 460 nm (%) | 89 | 92 | 94 | 94 | 94 | 94 | 94 | 94 | 94 | 95 | 94 |
| Reflectance at 460 nm after aging at 170° C. for 200 hours | 80 | 82 | 84 | 84 | 88 | 78 | 85 | 88 | 88 | 88 | 83 |
| Reflectance at 460 nm after aging at 170° C. for 500 hours | 68 | 72 | 76 | 78 | 81 | 72 | 78 | 81 | 80 | 82 | 74 |
| LED Reflector Molding Performance | | | | | | | | | | | |
| Demolding Performance Rating | 2 | 3 | 3 | 4 | 5 | 5 | 4 | 5 | 5 | 5 | 5 |
| Filling Performance Rating | 2 | 2 | 3 | 4 | 5 | 5 | 4 | 5 | 5 | 5 | 5 |
| Part Quality Performance Rating | 3 | 3 | 3 | 4 | 4 | 4 | 5 | 5 | 5 | 5 | 5 |

As shown above, the compositions containing a silicone compound and nucleating agent exhibited improved reflectance stability and molding processability.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A composition for producing molded parts comprising:
   a) from about 40% to about 80% by weight of a poly(1,4-cyclohexanedimethanol terephthalate);
   b) from about 1% to about 40% by weight of an inorganic filler;
   c) from about 2% to about 40% by weight of a titanium dioxide;
   d) from about 0.1% to about 5% by weight of a silicone compound; and
   e) from about 0.1% to about 5% by weight of a nucleating agent,
   wherein the composition has a Charpy impact strength of from 9 to 22 kJ/m$^2$.

2. The composition as defined in claim 1, wherein the silicone compound is a polysiloxane with a number average molecular weight above 1000.

3. The composition as defined in claim 1, wherein the silicone compound is an ultrahigh molecular weight polysiloxane.

4. The composition as defined in claim 1, wherein the silicone compound is comprised of polydimethylsiloxane, polydiphenylsiloxane, polydimethylsiloxane-diphenylsiloxane copolymer, polyalkylmethylsiloxane, alkylmethylsiloxane-arylalkylmethylsiloxane copolymer, poly(3,3,3-trifluoropropylmethylsiloxane), 3,3,3-trifluoropropylmethylsiloxane-dimethylsiloxane copolymer, a terminally functionalized polysiloxane, or mixtures thereof.

5. The composition as defined in claim 1, wherein the nucleating agent comprises a metal salt of an organic acid.

6. The composition as defined in claim 5, wherein the metal salt is comprised of sodium, lithium, potassium, calcium, magnesium, barium, aluminum, zinc, titanium, zirconium, or mixtures thereof.

7. The composition as defined in claim 5, wherein the organic acid is comprised of an aliphatic carboxylic acid, an aromatic carboxylic acid, a fatty acid, a montanic acid, a polymeric aliphatic carboxylic acid, or mixtures thereof.

8. The composition as defined in claim 1, wherein the titanium dioxide comprises a coating.

9. The composition as defined in claim 8, wherein the coating is selected from the group consisting of a carboxylic acid or a salt or ester thereof, a silicate a silane, and a metal oxide.

10. The composition as defined in claim 8, wherein the coating comprises a metal oxide.

11. The composition as defined in claim 1, wherein the polymeric material has an initial reflectance at 460 nm of greater than about 90%.

12. The composition as defined in claim 1, wherein the composition further comprises at least one impact modifier.

13. The composition as defined in claim 1, wherein the composition further comprises a phosphate, a phosphonate, or mixtures thereof.

14. The composition as defined in claim 1, wherein the composition further comprises a polyol ester, the polyol ester being present in an amount of from about 0.05% to about 5% by weight.

15. The composition as defined in claim 1, wherein the composition further comprises a polybutylene terephthalate, a liquid crystal polymer, or mixtures thereof.

16. A molded reflector, the reflector being molded from a polymeric material, the polymeric material being comprised of a poly(1,4-cyclohexanedimethanol terephthalate), a titanium dioxide, at least one silicone compound comprising a polysiloxane, and at least one nucleating agent, the polymeric material having a reflectance after aging at 170° C. for 200 hours of greater than about 60% and a Charpy impact strength of from 9 to 22 kJ/m$^2$.

17. The molded reflector as defined in claim 16, wherein the polymeric material further comprises an inorganic filler.

18. The molded reflector as defined in claim 16, wherein the polysiloxane is predispersed in a thermoplastic polyester.

19. The molded reflector as defined in claim 16, wherein the polysiloxane is an ultrahigh molecular weight polysiloxane.

20. The molded reflector as defined in claim 16, wherein the nucleating agent comprises a metal salt of an organic acid comprising sodium benzoate, sodium stearate, calcium stearate, zinc stearate, or mixtures thereof.

21. The molded reflector as defined in claim 16, wherein the polymeric material has an unnotched impact strength of from about 17 kJ/m$^2$ to about 23 kJ/m$^2$.

22. The molded reflector as defined in claim 16, wherein the polymeric material has a reflectance after aging at 170° C. for 200 hours of greater than about 80%.

23. The molded reflector as defined in claim 16, wherein the polymeric material has a melt viscosity at a shear rate of 1000/sec and at 305° C. of from about 40 Pa·s to about 150 Pa·s.

24. The molded reflector as defined in claim 16, wherein the polymeric material further comprises a phosphate, a phosphonate, or mixtures thereof, the phosphate, a phosphonate, or mixtures thereof being present in an amount of from about 0.05% to about 5% by weight.

25. The molded reflector as defined in claim 16, wherein the polymeric material further comprises a polyol ester, the polyol ester being present in an amount of from about 0.05% to about 5% by weight.

26. A light-emitting device comprising the molded reflector as defined in claim 16, the molded reflector having a top, a bottom, and at least one side wall extending from the top to the bottom, the top defining a reflective cavity that extends from a top surface towards the bottom, the reflective cavity surrounding a light-emitting diode, the light-emitting diode including an anode connected to a first lead frame member and a cathode connected to a second lead frame member, the cavity containing a silicone composition.

27. The molded reflector as defined in claim 16, wherein the polymeric material comprises from about 40% to about 80% by weight of the poly(1,4-cyclohexanedimethanol terephthalate), from about 1% to about 40% by weight of the inorganic filler, from about 2% to about 40% by weight of the titanium dioxide, from about 0.1% to about 5% by weight of the silicone compound, and from about 0.1% to about 5% by weight of the nucleating agent.

28. A molded reflector as defined in claim 16, wherein the polymeric material further comprises a hindered amine stabilizer, a hindered phenol, or mixtures thereof.

29. The molded reflector as defined in claim 16, wherein the polymeric material further comprises at least one more thermoplastic polymer comprising a polybutylene terephthalate, a liquid crystal polymer, or mixtures thereof, the at least one thermoplastic polymer being present in the polymeric material in an amount from about 0.05% to about 20% by weight.

30. The molded reflector as defined in claim 16, wherein the polymeric material further comprises a viscosity stabilizer comprising a phenoxy resin, alicyclic epoxy resin, or mixtures thereof, the viscosity stabilizer being present in the polymeric material in an amount from about 0.2% to about 8% by weight.

31. The molded reflector as defined in claim 16, wherein the polymeric material further comprises at least one impact modifier.

32. The molded reflector as defined in claim 16, wherein the polymeric material further comprises a benzoxazole, the benzoxazole being present in an amount of from about 0.01% to about 4% by weight.

33. A composition for producing molded parts comprising:
 a) a poly(1,4-cyclohexanedimethanol terephthalate);
 b) an inorganic filler;
 c) a white pigment;
 d) a silicone compound; and
 e) a nucleating agent;
 wherein the composition has a tensile modulus of from 5,862 to 7,599 MPa.

34. The composition as defined in claim 33 comprising:
 a) from about 40% to about 80% by weight of a poly(1,4-cyclohexanedimethanol terephthalate);
 b) from about 1% to about 40% by weight of an inorganic filler;
 c) from about 2% to about 40% by weight of a white pigment;
 d) from about 0.1% to about 5% by weight of with the silicone compound; and
 e) from about 0.1% to about 5% by weight of a nucleating agent.

* * * * *